(12) United States Patent
Schulze et al.

(10) Patent No.: US 9,293,330 B2
(45) Date of Patent: Mar. 22, 2016

(54) METHOD FOR PRODUCING A SEMICONDUCTOR

(71) Applicant: Infineon Technologies AG, Neubiberg (DE)

(72) Inventors: Hans-Joachim Schulze, Taufkirchen (DE); Ingo Muri, Villach (AT); Friedrich Kroener, Villach (AT); Werner Schustereder, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/011,832

(22) Filed: Aug. 28, 2013

(65) Prior Publication Data

US 2015/0064890 A1    Mar. 5, 2015

(51) Int. Cl.
| H01L 21/322 | (2006.01) |
| H01L 29/868 | (2006.01) |
| H01L 21/265 | (2006.01) |
| H01L 21/263 | (2006.01) |
| H01L 21/324 | (2006.01) |
| H01L 21/3063 | (2006.01) |

(52) U.S. Cl.
CPC ............ *H01L 21/265* (2013.01); *H01L 21/263* (2013.01); *H01L 21/26506* (2013.01); *H01L 21/3063* (2013.01); *H01L 21/3242* (2013.01)

(58) Field of Classification Search
USPC ........... 438/455, 459, 509, 530, 690; 257/656
See application file for complete search history.

(56) References Cited

U.S. PATENT DOCUMENTS

| 2006/0138607 A1* | 6/2006 | Nemoto ...................... 257/656 |
| 2008/0315364 A1* | 12/2008 | Nemoto ...................... 257/617 |
| 2009/0186464 A1* | 7/2009 | Morimoto et al. ............ 438/459 |
| 2010/0210091 A1* | 8/2010 | Mauder et al. ............... 438/459 |

* cited by examiner

*Primary Examiner* — Evan Pert
*Assistant Examiner* — Changhyun Yi

(57) ABSTRACT

A method for producing a semiconductor is disclosed, the method having: providing a semiconductor body having a first side and a second side; forming an n-doped zone in the semiconductor body by a first implantation into the semiconductor body via the first side to a first depth location of the semiconductor body; and forming a p-doped zone in the semiconductor body by a second implantation into the semiconductor body via the second side to a second depth location of the semiconductor body, a pn-junction forming between said n-doped zone and said p-doped zone in the semiconductor body.

13 Claims, 6 Drawing Sheets

METHOD FOR PRODUCING A SEMICONDUCTOR

TECHNICAL FIELD

The disclosure relates to methods for producing a semiconductor, and, in one or more embodiments, to methods for thinning semiconductor wafers, especially to methods for self-aligned thinning of silicon wafers.

BACKGROUND

For a multiplicity of applications of electronic semiconductor components and integrated circuits (IC), it is advantageous to restrict the total thickness of the semiconductor components and of the integrated circuits. Thus, for example, in disposable electronics and for chip cards and smart cards, a very small mass and a very small structural height are of importance. By using targeted settings of the thickness of the semiconductor body used, the electrical properties of e.g., vertical power semiconductor components can be improved by adapting the thickness of the semiconductor body to the voltage class of the respective power semiconductor component, in order to avoid unnecessary electrical resistance through over-dimensioned semiconductor bodies. However, this necessitates a very precise and reproducible thickness setting over the entire area of the semiconductor body used, in order to avoid losses of yield in production and in order to ensure reliable electrical properties of the semiconductor component and of the integrated circuit.

In the conventional related-art, p-type silicon is generally used as starting material of semiconductor wafers. For example, in US Pub. 2010/0210091, a method for self-aligned thinning of a semiconductor wafer is disclosed, wherein a p-doped substrate is used as the starting material. One problem with the conventional related-art is the restriction of the p-type substrate, because: on the one hand, in order to produce a well-defined extension of the space charge zone (also referred to herein as "space charge region") in the p-doped silicon substrate, a sufficient p-doping of the starting material must be ensured, with which a counter-doping, by the formation of thermal donors, of the p-type material should be avoided; on the other hand, in order to avoid strongly compensating of the basic doping caused by proton irradiation, which in turn requires much higher doses of surface proton irradiation, the p-doping of the starting substrate must not be too high.

Thus, there is a need in the art to provide an easy-controlled method for self-aligned and well-defined thinning of semiconductor wafers, with which a good reproducibility of the wafer thickness and a very good uniformity of wafer surface are possible to provide.

BRIEF SUMMARY

A method for producing a semiconductor according to various embodiments may include: providing a semiconductor body having a first side and a second side; forming an n-doped zone in the semiconductor body by a first implantation into the semiconductor body via the first side to a first depth location of the semiconductor body; and forming a p-doped zone in the semiconductor body by a second implantation into the semiconductor body via the second side to a second depth location of the semiconductor body, a pn-junction forming between said n-doped zone and said p-doped zone in the semiconductor body.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "front," "back," "leading," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Before the exemplary embodiments are explained in more detail below with reference to the figures, it is pointed out that identical elements are provided with the same or similar reference symbols in the Figures and that a repeated description of these elements is omitted. Furthermore, the Figures are not necessarily true to scale; rather, the main emphasis is on elucidating the basic principle.

The term pn-junction is defined hereinafter as the location in a semiconductor body at which an n-type dopant concentration $C_D$ of the semiconductor body falls below a p-type dopant concentration $C_P$ of the semiconductor body or a p-type dopant concentration $C_P$ falls below an n-type dopant concentration $C_D$ of the semiconductor body.

The term end-of-range is defined hereinafter as an end of the region which is irradiated by the implantation and in which the majority of the protons is incorporated during the implantation.

One or more embodiments provide a method for thinning a semiconductor wafer which permits an exact and reproducible thinning of the silicon wafer.

Figure 1:
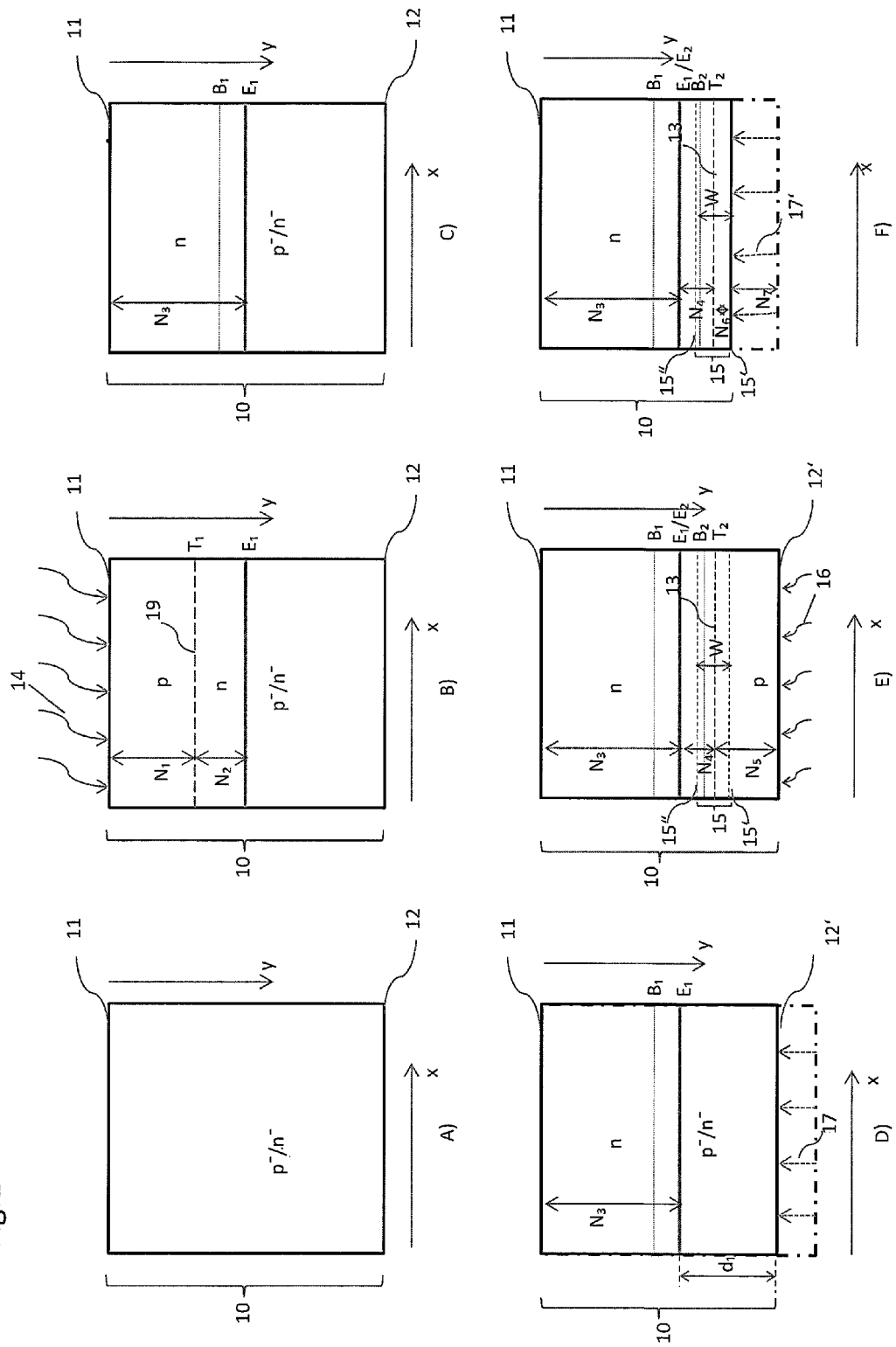
FIG. 1A shows a cross-sectional view of a starting semiconductor body.
FIG. 1B shows a cross-sectional view of the semiconductor body after the first-side proton implantation.
FIG. 1C shows a cross-sectional view of the semiconductor body after a thermal process.
FIG. 1D shows a cross-sectional view of the semiconductor body after mechanical grinding.
FIG. 1E shows a cross-sectional view of the semiconductor body after the second-side proton implantation.
FIG. 1F shows a cross-sectional view of the semiconductor body after etching.
Figure 2:
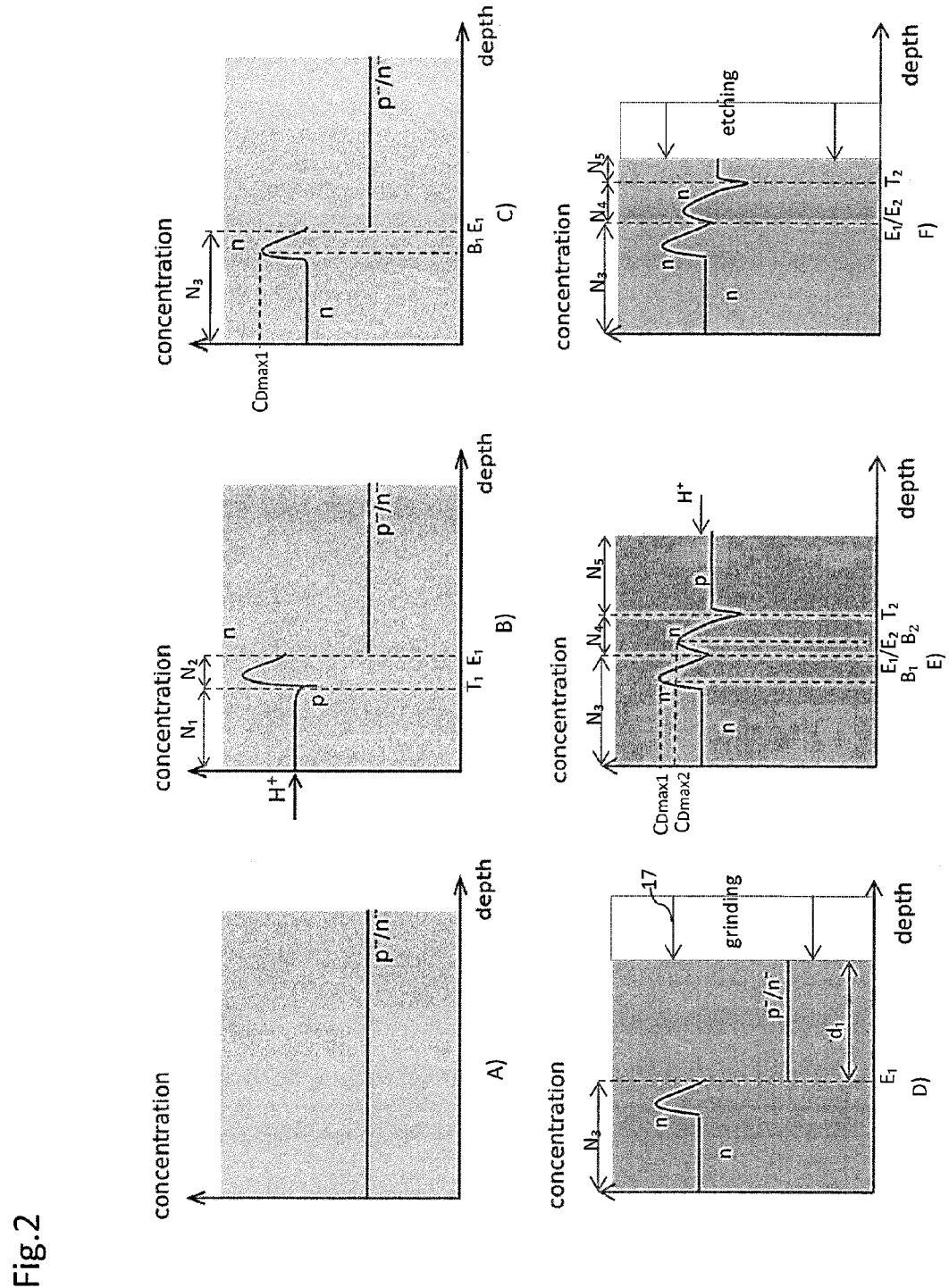
FIG. 2A shows a doping profile of a starting semiconductor body.
FIG. 2B shows a doping profile of the semiconductor body after the first-side proton implantation.
FIG. 2C shows a doping profile of the semiconductor body after a thermal process.
FIG. 2D shows a doping profile of the semiconductor body after mechanical grinding.
FIG. 2E shows a doping profile of the semiconductor body after the second-side proton implantation.
FIG. 2F shows a doping profile of the semiconductor body after etching.

FIG. 1A illustrates a starting semiconductor body 10 having a first side 11 and a second side 12, wherein the direction leading from the first side 11 to the second side 12 is designated as the positive y-direction. The starting semiconductor body 10 is typically a semiconductor wafer. Such wafers are normally starting products for the mass production of semiconductor components and are available in sizes of currently approximately 750 µm thickness (y-direction) and up to 300 mm diameter (x-direction). The starting semiconductor body 10 used here has a high resistance. Silicon is principally suitable as starting semiconductor material for the semiconductor body 10. In one or more embodiments, the sheet resistance of the starting semiconductor body 10 is above 1000 Ohm-cm. In one embodiment, the starting semiconductor body 10 is low-doped with a p-type dopant, such that the semiconductor body 10 has a p-type basic doping. The electrical conductivity of the semiconductor 10 is therefore initially determined by "holes" as majority carriers. In such embodiment, the density of holes in the low-p-doped semiconductor body is below $5 \times 10^{12}$ holes per $cm^3$. In another embodiment, the starting semiconductor body 10 is low-doped with an n-type dopant, such that the semiconductor body 10 has an n-type basic doping. The electrical conductivity of the semiconductor 10 is therefore initially determined by "donors" as majority carriers. In such embodiment, the density of donors in the low-n-doped semiconductor body is below $2 \times 10^{12}$ holes per $cm^3$. FIG. 2A illustrates one embodiment of a doping profile of the starting semiconductor body 10. The doping concentration of the starting semiconductor body 10 is uniformly through the entire depth (y-direction).

As illustrated in FIG. 1B, protons 14 are implanted into the semiconductor body 10 via the first side 11 until the end-of-range at a depth $E_1$ of the semiconductor body 10. The proton dose and energy are chosen depending on the desired vertical extension of a drift zone. It holds true that for the same proton dose, the higher the proton energy, the larger extension will a drift zone have, and that for a given proton energy, the higher the proton dose, the higher doping level will a drift zone have for a given annealing temperature. In one embodiment, the proton irradiation dose is of between $2 \times 10^{13}$ per $cm^2$ and $8 \times 10^{14}$ per $cm^2$, and the proton energy is typically between 2 MeV to 5 MeV. This gives rise to a p-doped zone $N_1$, an n-doped zone $N_2$ and accordingly a pn-junction 19 in the region between the first side 11 and the end-of-range at depth $E_1$ of the semiconductor body 10. FIG. 2B illustrates one embodiment of a doping profile of the proton-implanted region in the semiconductor body 10. A p-doped zone $N_1$ extends from the surface of the first side 11 of the semiconductor body 10 as far as a depth $T_1$ in the y-direction, and an n-doped zone $N_2$ extents from the depth $T_1$ as far as the end-of-range at depth $E_1$, accordingly a pn-junction 19 arises at the depth $T_1$, where the p-doped zone $N_1$ meets the n-doped zone $N_2$.

Afterwards, the p-doped zone $N_1$ is converted. As illustrated in FIG. 1C, at least the region between the first side 11 and the end-of-range at depth $E_1$ which has been implanted with protons 14 is subjected to heat treatment, that is to say heated and held at this temperature level for a specific time. This converts the p-doped zone $N_1$ produced by the proton-implantation 14 through the first side 11 of the semiconductor 10 by the diffusion of hydrogen atoms from the end of range of the first proton irradiation up to the first side surface 11, so that donor-like complexes can be formed by the interaction of the hydrogen atoms with the irradiation-induced defects. In one or more embodiments, the heating (heat treatment) of the semiconductor body 10 that is effected after the proton irradiation 14 includes an annealing phase in the range of between e.g. 470° C. and 520° C., since the hydrogen-induced n-type doping forms in this temperature range. In one embodiment, the annealing phase is carried out for at least 1 hour and can also take place over a number of hours, like e.g. 20 hours. FIG. 2C illustrates one embodiment of a doping profile of the semiconductor body 10 after annealing. A new n-doped zone $N_3$ is formed, which includes the previous p-doped zone $N_1$ and n-doped zone $N_2$. The new n-doped zone $N_3$ extends from the surface of the first side 11 as far as the end-of-range at depth $E_1$, having an n-type dopant maximum $C_{Dmax1}$ at the depth $B_1$ in the semiconductor body 10.

Alternatively, the semiconductor body 10 is thinned from the second side 12 subsequently. FIG. 1D illustrates one embodiment of thinning the semiconductor body 10 subsequent to the first-side proton irradiation and heat treatment. The thinning is performed in a negative y-direction, i.e. from the second side 12 toward the first side 11, as illustrated by arrows 17. In one or more embodiments the thinning is carried out by a mechanical grinding. The mechanical grinding is performed as far as a predefined depth $d_1$ away from the end-of-range at depth $E_1$, and accordingly a thinned second side 12' is formed. The predefined depth $d_1$ is chosen in such a manner that an end-of-range of the second-side implantation (will be described for FIG. 1E) falls into the area of the end-of-range at depth $E_1$, or even slightly over the area of the end-of-range at depth $E_1$. FIG. 2D illustrates a doping profile of the semiconductor body 10 after the grinding. A residual of the starting semiconductor body 10 with a depth of $d_1$ is left, adjacent to the n-doped zone $N_3$.

Next step, an implantation is performed via the second side 12'. FIG. 1E illustrates one embodiment with the semiconductor body 10 having a first side 11 and a thinned second side 12'. As illustrated in FIG. 1E, protons 16 are implanted into the semiconductor body 10 via the thinned second side 12'. In one embodiment, the irradiation dose and proton energy are chosen in such a manner that an end-of-range at depth $E_2$ of the second-side implantation is adjacent to the end of range at depth $E_1$, as illustrated in FIG. 1E. This gives rise to a p-doped zone $N_5$ near the thinned second side 12', an n-doped zone $N_4$ with an n-type dopant maximum $C_{Dmax2}$ at the depth $B_2$ in the semiconductor body 10, and accordingly a pn-junction 13 at a depth $T_2$, which is between the thinned second side 12' and the end-of-range at depth $E_2$. FIG. 2E illustrates one embodiment of the semiconductor body 10 after a second-side proton implantation. As illustrated in FIG. 2E, the p-doped zone $N_5$ extends from the surface of the thinned second side 12' of the semiconductor body 10 as far as the pn-junction 13 at the depth $T_2$ into the semiconductor body 10. In relation to the illustrated example, the n-type dopant maximum $C_{Dmax2}$ created by the second-side implantation is smaller than the n-type dopant maximum $C_{Dmax1}$, and depth $B_2$ of the n-type dopant maximum $C_{Dmax2}$ is close enough to the depth $B_1$ of the n-type dopant maximum $C_{Dmax1}$, so that the n-type dopant maximum $C_{Dmax2}$ will not become higher than the n-type dopant maximum $C_{Dmax1}$ after the subsequent optional annealing process. Back to FIG. 1E, a space charge zone 15 spanned at the pn-junction 13 or the pn-junction itself can be used for a precise ending of the rear-side removal of the original semiconductor body, thereby enabling an exact and reproducible thinning of the semiconductor body to a desired and predetermined final thickness. The space charge zone 15 has a boundary 15' situated in the p-doped zone $N_5$, and a boundary 15" situated in the n-doped zone $N_4$, or even in the n-doped zone $N_3$, depending on a bias voltage applied on the space charge zone 15.

Alternatively, a heating subsequent to the second-side proton-implantation into the semiconductor body 10 is performed (not shown in the Figs.). The heating includes an annealing phase, wherein the temperature range and the annealing phase duration are chosen in such a manner that the p-doped zone $N_5$ is guaranteed not to be converted, and in the meanwhile, to avoid the n-type dopant maximum $C_{Dmax2}$ becoming higher than the n-type dopant maximum $C_{Dmax1}$ (in some embodiments, the n-type dopant maximum $C_{Dmax2}$ may also be higher than the n-type dopant maximum $C_{Dmax1}$ after annealing). In particular, it is important that the depth of the resulting pn-junction is controlled by the n-type doping resulted from the front-side irradiation and the p-type doping resulted from the second-side irradiation. In one embodiment, the annealing phase is effected at temperature range of e.g. between 220° C. and 400° C., e.g. between 320° C. and 380° C. In another embodiment, the annealing phase is effected at temperatures below 350° C., and has a duration between 1 hour and 5 hours.

After the formation of the p-doped zone $N_5$ and the pn-junction 13, in thermodynamic equilibrium as a result of diffusion of charge carriers across the pn-junction 13, a space charge zone 15 forms as far as a boundary 15" in the n-doped zone $N_4$ (or even in the n-doped zone $N_3$) and as far as a boundary 15' in the p-doped zone $N_5$. FIG. 1E shows one embodiment as the boundary 15" situated in the n-doped zone $N_4$. However, the boundary 15" is not limited to be situated within the n-doped zone $N_4$, i.e., the space charge zone 15 may also extend to the n-doped zone $N_3$. As a result of the fixed charges remaining, the previously electrically neutral crystals have now acquired a space charge that charges the p-type crystal negatively and the n-type crystal positively. The resultant electrical voltage is called the diffusion voltage $U_D$.

By applying an external bias voltage across the pn-junction 13, the boundaries 15' and 15" can be displaced and the width W of the space charge zone 15 can thus be controlled. By applying the external bias voltage in the reverse direction of the pn-junction 13 (+ at the n-doped zone $N_4$, − at the p-doped zone $N_5$), by way of example, the width W of the space charge zone 15 is increased. If the external bias voltage is polarized in the forward direction of the pn-junction 13 (− at the n-doped zone $N_4$, + at the p-doped zone $N_5$), the width W of the space charge zone 15 is decreased. As soon as the external bias voltage with polarization in the forward direction is greater than or equal to the diffusion voltage $U_D$, the space charge zone 15 is dissolved, that is to say that the boundaries 15' and 15" fall on top of one another and the width W of the space charge zone is equal to zero.

After the formation of pn-junction 13 and a space charge zone 15 that possibly occurs, the semiconductor body 10 is thinned from the thinned second side 12'. As illustrated in FIG. 1F, in one embodiment, a space charge zone 15 with a width W is spanned at the pn-junction 13, this takes place by removing the second side 12' of the semiconductor body 10 in the negative y-direction as far as the space charge zone 15, that is to say as far as the boundary 15' of the space charge zone 15 that is situated in the p-doped zone $N_5$, as illustrated by arrows 17' in FIG. 1F. Consequently, a region $N_7$ of the semiconductor body is removed, while a residue $N_6$ of the p-doped zone in the semiconductor body 10 remains in the thinned state at the second side.

By way of example, by using suitable setting of the bias voltage value across the pn-junction, the space charge zone can be extended up to 5 µm into the p-doped zone $N_5$, which results in a correspondingly thick p-doped residual layer $N_6$ after the thinning. In the case of a dissolved space charge zone 15, the second side is removed as far as the pn-junction 13 (not shown in Figs.), that is to say that the p-doped zone $N_5$ is completely removed.

The removal of the second side 12' can in any case be effected in a locally delimited manner by using masks, for example, or else over the whole area over the entire semiconductor body 10. The removal of the second side 12' is generally effected at least in part by using an electrochemical etching method wherein the boundary 15' of the space charge zone or, in absence of a space charge zone, the pn-junction 13 is used as an "etching stop" for ending the etching process. When this "etching stop" is reached, the etching process automatically terminates; in other words, the etching stop is effected in a self-aligned manner in this way. A very exact removal of the second side 12' of the semiconductor body 10 is thus possible. By way of example, a characteristic change in a current flowing within the electrochemical etching apparatus is measured when the "etching stop" is reached, which is used for ending the etching process. In one embodiment, a pure potassium hydroxide solution (KOH), tetramethylammonium hydroxide solution (TMAH), ethylenediamine (EDP) or hydrazine-water solutions can be used as etching solutions. If desired, after exactly removing of the second side 12' of the semiconductor body 10, additionally a small portion or all of $N_6$ layer can be removed by using an additional etching step or chemical mechanical polishing step. If desired, this further removal of semiconductor material can extend into the n-doped zone $N_4$, or even extend to the n-doped zone $N_3$. Mechanical removal methods can also be used at the beginning of the removal of the second side 12' of the semiconductor body 10.

Figure 3:
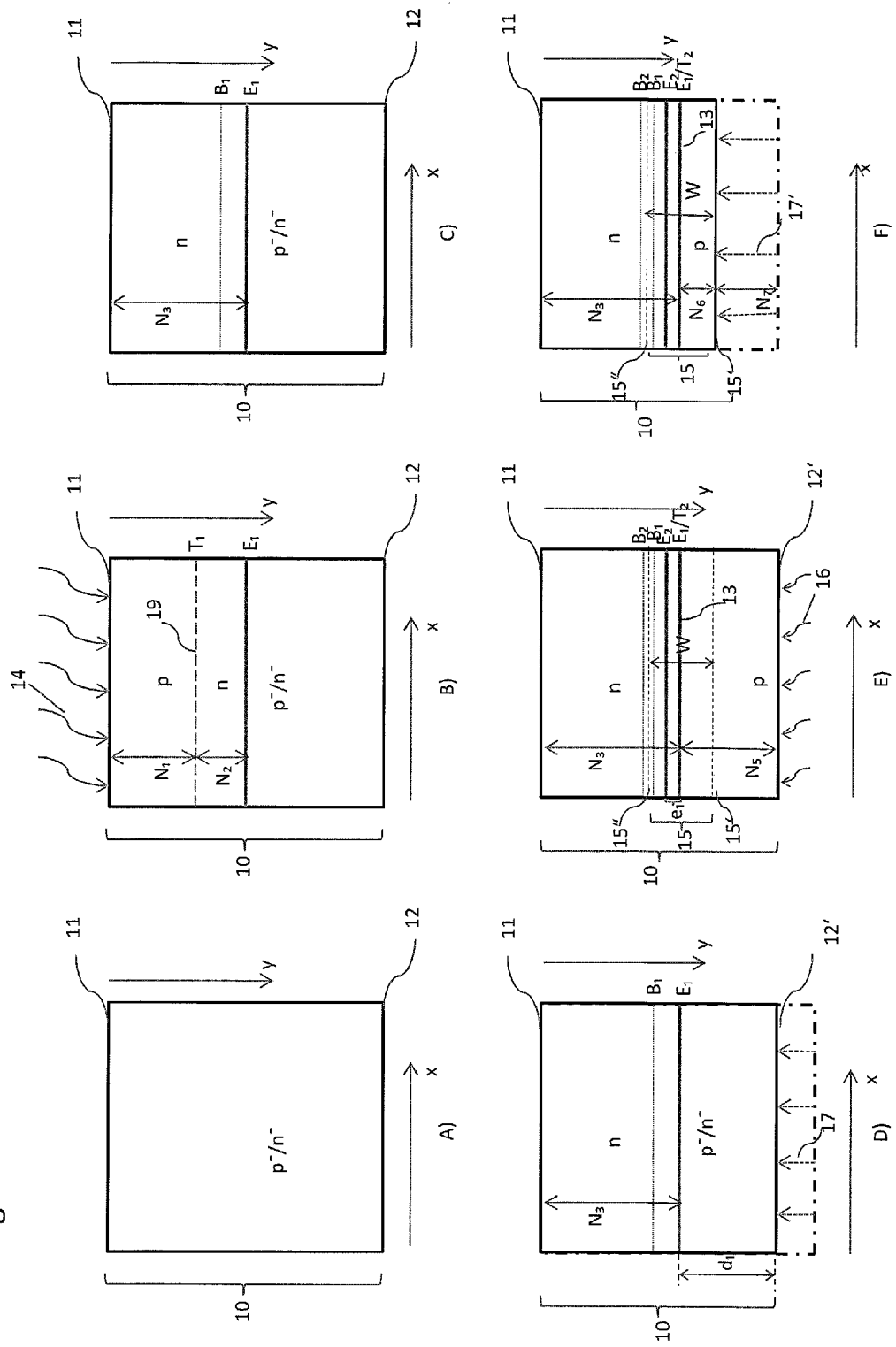
FIGS. 3A-3F show another embodiment of thinning a semiconductor wafer.
Figure 4:
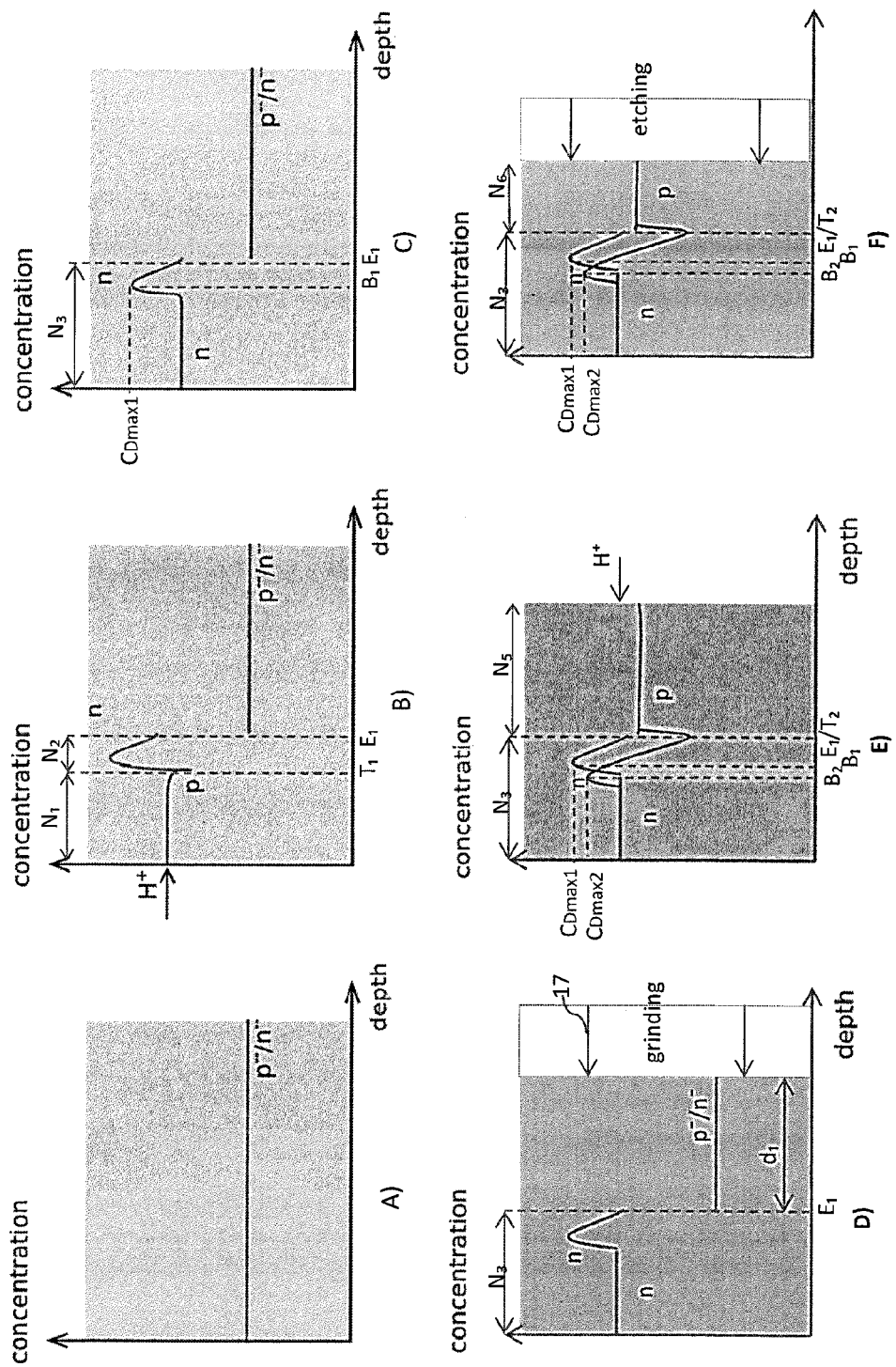
FIGS. 4A-4F show the corresponding doping profiles of the methods shown in FIGS. 3A-3F.

FIGS. 3A-3F illustrates another embodiment of thinning a semiconductor body 10. And FIGS. 4A-4F are the corresponding doping profiles. In particular, FIGS. 3A-3D comprise similar steps as in FIGS. 1A-1D, for the reason of abbreviation, the steps related to these figures are not repeatedly described here. Turn to FIG. 3E, a proton implantation is performed via the thinned second side 12'. FIG. 4E illustrates one embodiment with the semiconductor body 10 having a first side 11 and a thinned second side 12'. As illustrated in FIG. 3E, protons 16 are implanted into the semiconductor body 10 via the thinned second side 12'. One difference between the method step shown in FIG. 1E and the method step shown in FIG. 3E is the proton implantation dose and energy for the second-side implantation, wherein in FIG. 3E, the irradiation dose and proton energy are chosen in such a manner that an end-of-range at depth $E_2$ of the second-side implantation is slightly over the end-of-range at depth $E_1$, with a distance $e_1$ which defines an overlap between the region irradiated by the first-side implantation and the region irradiated by the second-side implantation, as illustrated in FIG. 1E. This gives rise to a p-doped zone $N_5$ near the thinned second side 12', an n-type dopant maximum $C_{Dmax2}$ produced by the second-side implantation at the depth $B_2$ in the semiconductor body 10, and accordingly a pn-junction 13 at a depth $T_2$, which is the same position as the end-of-range at depth $E_1$. FIG. 4E illustrates one embodiment of the semiconductor body 10 after a second-side proton implantation. As illustrated in FIG. 4E, the p-doped zone $N_5$ extends from the surface of the thinned second side 12' of the semiconductor body 10 as far as the pn-junction 13 at the depth $T_2$ (and/or the depth $E_1$) into the semiconductor body 10. The n-type dopant maximum $C_{Dmax2}$ produced by the second-side irradiation is at a depth $B_2$, which is in the same position as depth $B_1$, or even closer to the first side 11 of the semiconductor body 10 than the position $B_1$ of the n-type dopant maximum $C_{Dmax1}$, so as the position of pn-junction can be well-controlled by the p-type doping from the thinned second side 12' and the n-type doping from the first side 11 of the semiconductor body 10. Back to FIG. 3E, a space charge zone 15 spanned at the pn-junction 13 or the pn-junction itself can be used for a precise ending of the rear-side removal of the original semiconductor body, thereby enabling an exact and reproducible thinning of the semiconductor body to a desired and predetermined final thickness. The space charge zone 15 has a boundary 15' situated in the p-doped zone $N_5$, and a boundary 15" situated in the n-doped zone $N_3$.

Alternatively, a heating subsequent to the second-side proton-implantation into the semiconductor body 10 is performed (not shown in the Figs.). The heating includes an annealing phase, wherein the temperature range and the annealing phase duration are chosen in such a manner that the p-doped zone $N_5$ is guaranteed not to be converted. In one embodiment, the annealing phase is effected at temperature range of e.g. between 220° C. and 400° C., e.g. between 320° C. and 380° C. In one embodiment, the annealing phase is effected at temperatures below 350° C.

After the formation of the p-doped zone $N_5$ and the pn-junction 13, in thermodynamic equilibrium as a result of diffusion of charge carriers across the pn-junction 13, a space charge zone 15 forms as far as a boundary 15" in the n-doped zone $N_3$ and as far as a boundary 15' in the p-doped zone $N_5$. As a result of the fixed charges remaining, the previously electrically neutral crystals have now acquired a space charge that charges the p-type crystal negatively and the n-type crystal positively. The resultant electrical voltage is called the diffusion voltage $U_D$.

By applying an external bias voltage across the pn-junction 13, the boundaries 15' and 15" can be displaced and the width W of the space charge zone 15 can thus be controlled. By applying the external bias voltage in the reverse direction of the pn-junction 13 (+ at the n-doped zone $N_3$, − at the p-doped zone $N_5$), by way of example, the width W of the space charge zone 15 is increased. If the external bias voltage is polarized in the forward direction of the pn-junction 13 (− at the n-doped zone $N_3$, + at the p-doped zone $N_5$), the width W of the space charge zone 15 is decreased. As soon as the external bias voltage with polarization in the forward direction is greater than or equal to the diffusion voltage $U_D$, the space charge zone 15 is dissolved, that is to say that the boundaries 15' and 15" fall on top of one another and the width W of the space charge zone is equal to zero.

After the formation of pn-junction 13 and a space charge zone 15 that possibly occurs, the semiconductor body 10 is thinned from the thinned second side 12'. As illustrated in FIG. 3F, in one embodiment, a space charge zone 15 with a width W is spanned at the pn-junction 13, this takes place by removing the second side 12' of the semiconductor body 10 in the negative y-direction as far as the space charge zone 15, that is to say as far as the boundary 15' of the space charge zone 15 that is situated in the p-doped semiconductor body $N_5$, as illustrated by arrows 17' in FIG. 3F. Consequently, a region $N_7$ of the semiconductor body is removed, while a residue $N_6$ of the p-doped zone in the semiconductor body 10 remains in the thinned state at the second side.

The removal of the second side 12' can in any case be effected in a locally delimited manner by using masks, for example, or else over the whole area over the entire semiconductor body 10. The removal of the second side 12' is generally effected at least in part by using an electrochemical etching method wherein the boundary 15' of the space charge zone or, in absence of a space charge zone, the pn-junction is used as an "etching stop" for ending the etching process. When this "etching stop" is reached, the etching process automatically terminates; in other words, the etching stop is effected in a self-aligned manner in this way. A very exact removal of the second side 12' of the semiconductor body 10 is thus possible. By way of example, a characteristic change in a current flowing within the electrochemical etching apparatus is measured when the "etching stop" is reached, which is used for ending the etching process. If desired, after exactly removing of the second side 12' of the semiconductor body 10, additionally a small portion or all of $N_6$ layer can be removed by using an additional etching step or chemical mechanical polishing step. If desired, this further removal of semiconductor material can even extend to the n-doped zone $N_3$. Mechanical removal methods can also be used at the beginning of the removal of the second side 12' of the semiconductor body 10.

Figure 5:
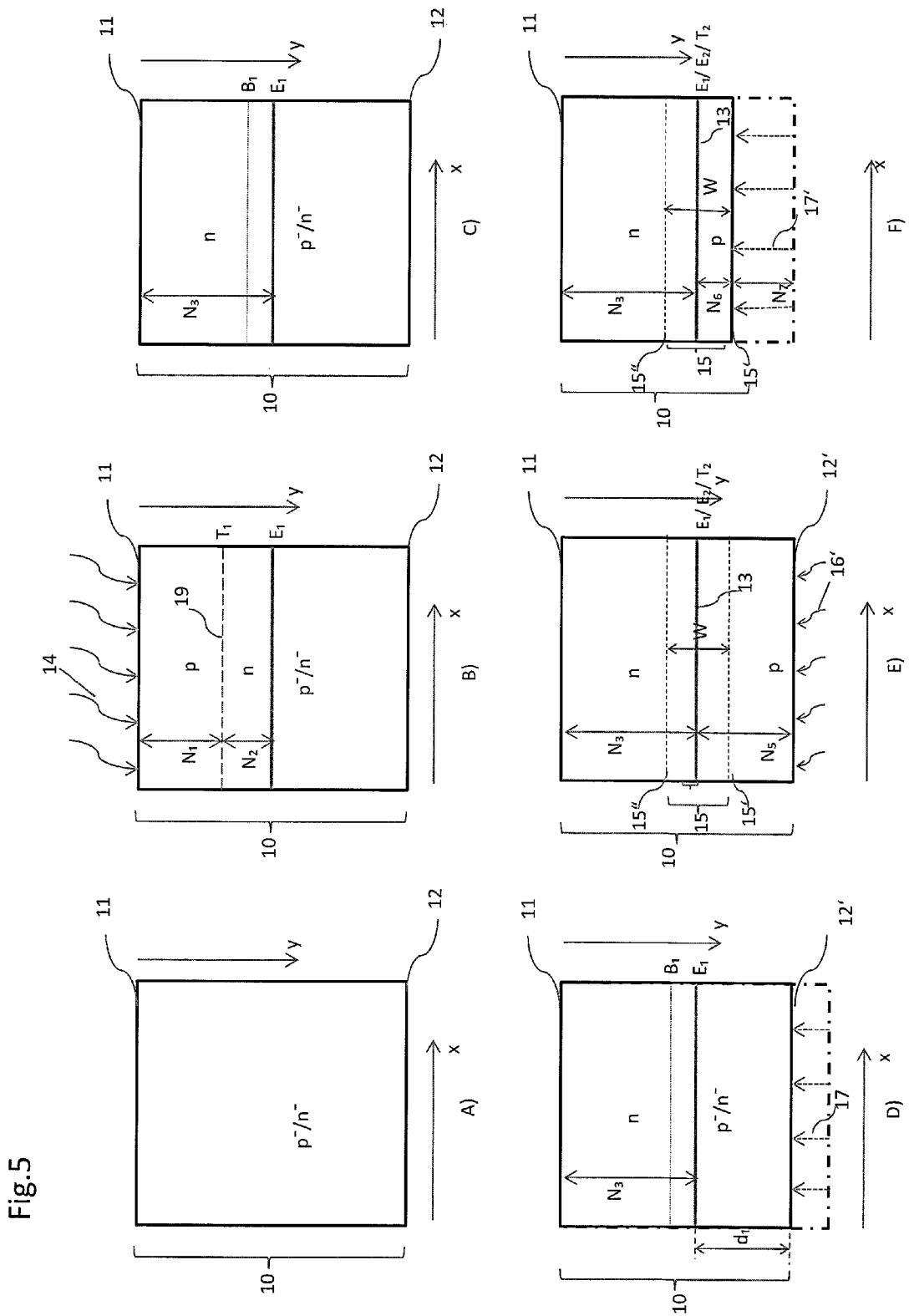
FIGS. 5A-5F show another embodiment of thinning a semiconductor wafer.
Figure 6:
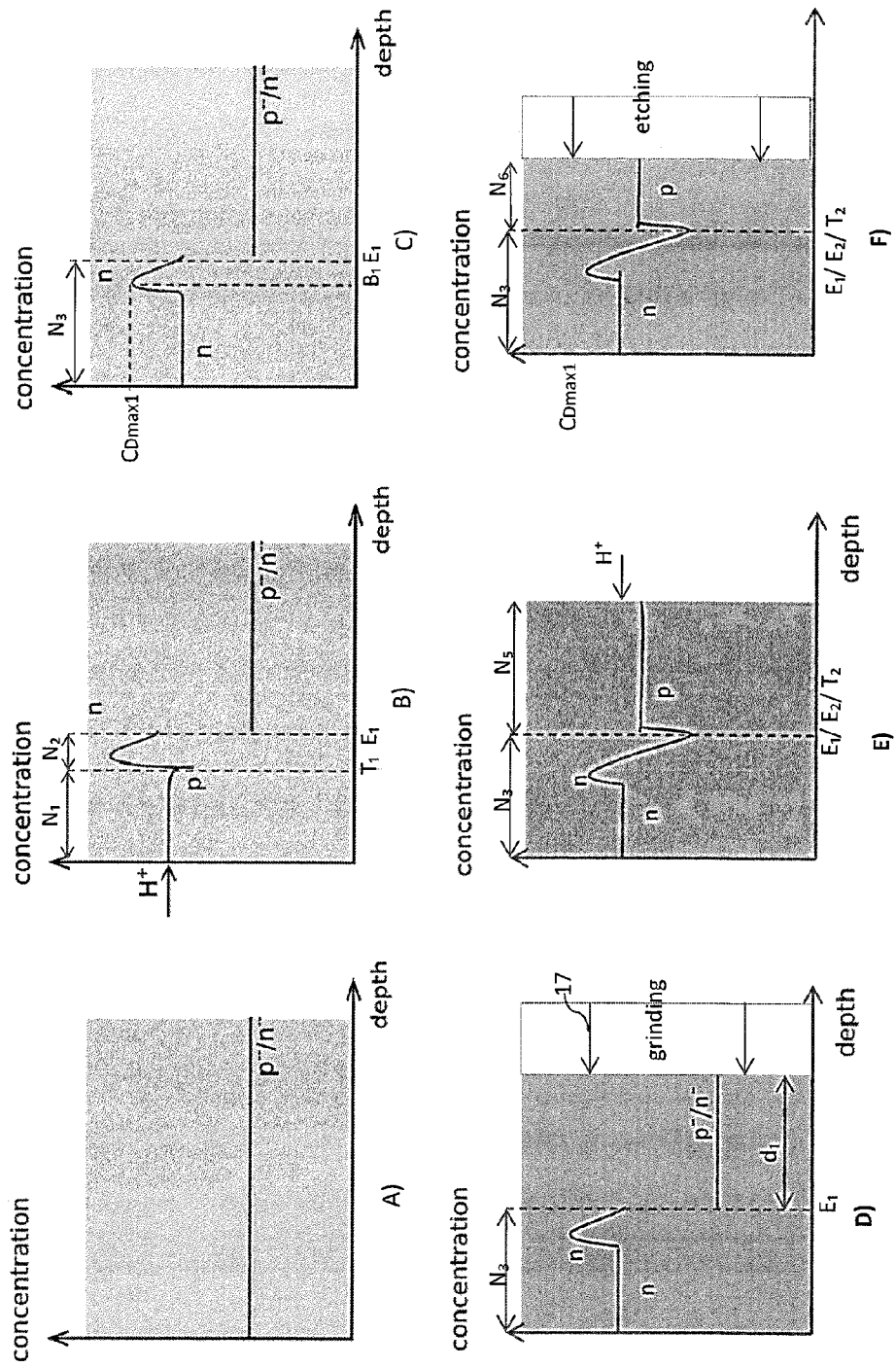
FIGS. 6A-6F show the corresponding doping profiles of the methods shown in FIGS. 5A-5F.

FIGS. 5A-5F illustrates another embodiment of thinning a semiconductor body 10. And FIGS. 6A-6F are the corresponding doping profiles. In particular, FIGS. 5A-5D comprise similar steps as in FIGS. 1A-1D, for the reason of abbreviation, the steps related to these figures are not repeatedly described here. The difference between the embodiments shown in FIGS. 1A-1F and the embodiment shown in FIG. 5A-5F is that the second-side irradiation is carried out by a helium irradiation, with implantation energy lying in the range of between 2 MeV and 15 MeV, and implantation dose lying in the range of between $5 \times 10^{12}$ per $cm^2$ and $1 \times 10^{14}$ per $cm^2$. Turn to FIG. 5E, a helium irradiation is performed via the thinned second side 12'. FIG. 5E illustrates one embodiment with the semiconductor body 10 having a first side 11 and a thinned second side 12'. As illustrated in FIG. 5E, helium 16' is implanted into the semiconductor body 10 via the thinned second side 12'. The helium irradiation dose and energy are chosen in such a manner that an end-of-range at depth $E_2$ of the second-side implantation is adjacent to the end-of-range at depth $E_1$, as illustrated in FIG. 5E. This gives rise to a p-doped zone $N_5$ near the thinned second side 12', and a pn-junction 13 at a depth $T_2$, which is the same position as or close to the end-of-range at depth $E_1$. FIG. 6E illustrates one embodiment of the semiconductor body 10 after a second-side helium irradiation. As illustrated in FIG. 6E, the p-doped zone $N_5$ extends from the surface of the thinned second side 12' of the semiconductor body 10 as far as the pn-junction 13 at the depth $T_2$ (and/or the depth $E_1$) into the semiconductor body 10. Back to FIG. 5E, a space charge zone 15 spanned at the pn-junction 13 or the pn-junction itself can be used for a precise ending of the rear-side removal of the original semiconductor body, thereby enabling an exact and reproducible thinning of the semiconductor body to a desired and predetermined final thickness. The space charge zone 15 has a boundary 15' situated in the p-doped zone $N_5$, and a boundary 15" situated in the n-doped zone $N_3$.

Alternatively, a heating subsequent to the second-side Helium-irradiation into the semiconductor body 10 is performed (not shown in the Figs). The heating includes an annealing phase, wherein the temperature range and the annealing phase duration are chosen in such a manner that the p-doped zone $N_5$ is guaranteed not to be converted.

After the formation of the p-doped zone $N_5$ and the pn-junction 13, in thermodynamic equilibrium as a result of diffusion of charge carriers across the pn-junction 13, a space charge zone 15 forms as far as a boundary 15" in the n-doped zone $N_3$ and as far as a boundary 15' in the p-doped zone $N_5$. As a result of the fixed charges remaining, the previously electrically neutral crystals have now acquired a space charge that charges the p-type crystal negatively and the n-type crystal positively. The resultant electrical voltage is called the diffusion voltage U.

By applying an external bias voltage across the pn-junction 13, the boundaries 15' and 15" can be displaced and the width W of the space charge zone 15 can thus be controlled. By applying the external bias voltage in the reverse direction of the pn-junction 13 (+ at the n-doped zone $N_3$, – at the p-doped zone $N_5$), by way of example, the width W of the space charge zone 15 is increased. If the external bias voltage is polarized in the forward direction of the pn-junction 13 (– at the n-doped zone $N_3$, + at the p-doped zone $N_5$), the width W of the space charge zone 15 is decreased. As soon as the external bias voltage with polarization in the forward direction is greater than or equal to the diffusion voltage $U_D$, the space charge zone 15 is dissolved, that is to say that the boundaries 15' and 15" fall on top of one another and the width W of the space charge zone is equal to zero.

After the formation of pn-junction 13 and a space charge zone 15 that possibly occurs, the semiconductor body 10 is thinned from the thinned second side 12'. As illustrated in FIG. 5F, in one embodiment, a space charge zone 15 with a width W is spanned at the pn-junction 13, this takes place by removing the second side 12' of the semiconductor body 10 in the negative y-direction as far as the space charge zone 15, that is to say as far as the boundary 15' of the space charge zone 15 that is situated in the p-doped semiconductor body $N_5$, as illustrated by arrows 17' in FIG. 5F. Consequently, a region $N_7$ of the semiconductor body is removed, while a residue $N_6$ of the p-doped zone in the semiconductor body 10 remains in the thinned state at the second side.

The removal of the second side 12' can in any case be effected in a locally delimited manner by using masks, for example, or else over the whole area over the entire semiconductor body 10. The removal of the second side 12' is generally effected at least in part by using an electrochemical etching method wherein the boundary 15' of the space charge zone or, in absence of a space charge zone, the pn-junction is used as an "etching stop" for ending the etching process. When this "etching stop" is reached, the etching process automatically terminates; in other words, the etching stop is effected in a self-aligned manner in this way. A very exact removal of the second side 12' of the semiconductor body 10 is thus possible. By way of example, a characteristic change in a current flowing within the electrochemical etching apparatus is measured when the "etching stop" is reached, which is used for ending the etching process. If desired, after exactly removing of the second side 12' of the semiconductor body 10, additionally a small portion or all of $N_6$ layer can be removed by using an additional etching step or chemical mechanical polishing step. If desired, this further removal of semiconductor material can even extend to the n-doped zone $N_3$. Mechanical removal methods can also be used at the beginning of the removal of the second side 12' of the semiconductor body 10.

In some embodiments, the dose and energy of the second-side irradiation are chosen in such a manner that the p-doped zone near the thinned second side 12' has a high concentration (not illustrated in the Figs). The resultant "rear-side" highly doped p-type zone can be used, for example, as a p-type emitter for an IGBT.

A method for producing a semiconductor in accordance with various embodiments may include: providing a semiconductor body having a first side and a second side; forming an n-doped zone in the semiconductor body by a first implantation into the semiconductor body via the first side to a first depth location of the semiconductor body; and forming a p-doped zone in the semiconductor body by a second implantation into the semiconductor body via the second side to a second depth location of the semiconductor body, a pn-junction forming between said n-doped zone and said p-doped zone in the semiconductor body.

In one or more embodiments, the first depth location and the second depth location of the semiconductor body may be measured relative to the first side of the semiconductor body.

In one or more embodiments, the first and second sides may be opposite sides of the semiconductor body.

In one or more embodiments, the first side may be a top side and the second side may be a bottom side of the semiconductor body.

In one or more embodiments, the first side may be a front side and the second side may be a back side (e.g. of a semiconductor wafer).

In one or more embodiments, the second depth location may be at the same location as the first depth location of the semiconductor body.

In one or more embodiments, the second depth location may be between the first side and the first depth location of the semiconductor body.

In one or more embodiments, the second depth location may be between the second side and the first depth location of the semiconductor body, wherein the second depth location is close enough to the first depth location, such that a depth location of said pn-junction may be controlled by the n-doped zone from the first implantation and the p-doped zone from the second implantation.

In one or more embodiments, the first implantation may be an implantation of protons.

In one or more embodiments, the first implantation of protons may be effected with an implantation energy lying in a range of between 2 MeV and 5 MeV.

In one or more embodiments, the first implantation of protons may be effected with a dose of protons lying in a range of between $2 \times 10^{13}$ protons per $cm^2$ and $8 \times 10^{14}$ protons per $cm^2$, e.g. in a range of between $1 \times 10^{14}$ protons per $cm^2$ and $4 \times 10^{14}$ protons per $cm^2$.

In one or more embodiments, the method may further include performing a first anneal of the semiconductor body after the first implantation.

In one or more embodiments, the method may further include performing a first thinning after forming the n-doped zone and before forming the p-doped zone.

In one or more embodiments, the method may further include performing a first anneal of the semiconductor body after the first implantation of protons and performing a first thinning after performing the first anneal and before forming the p-doped zone.

In one or more embodiments, the first anneal may be performed at a temperature range of between 470° C. and 520° C.

In one or more embodiments, the method may further include performing a second anneal of the semiconductor body after the second implantation.

In one or more embodiments, the second implantation may be an implantation of protons.

In one or more embodiments, the second implantation of protons may be effected with an implantation energy lying in a range of between 1 MeV and 4 MeV.

In one or more embodiments, the second implantation of protons may be effected with a dose of protons lying in a range of between $1\times10^{13}$ protons per cm$^2$ and $5\times10^{14}$ protons per cm$^2$.

In one or more embodiments, the method may further include performing a second anneal of the semiconductor body after the second implantation of protons.

In one or more embodiments, the second anneal may be performed at a temperature range of between 220° C. and 400° C.

In one or more embodiments, the second implantation may be an implantation of helium.

In one or more embodiments, the second implantation of helium may be effected with an implantation energy lying in a range of between 2 MeV and 15 MeV.

In one or more embodiments, the second implantation of helium may be effected with a dose of helium lying in a range of between $5\times10^{12}$ per cm$^2$ and $1\times10^{14}$ per cm$^2$.

In one or more embodiments, the method may further include electrochemically etching the second side of the semiconductor body after forming the p-doped zone.

In one or more embodiments, the method may further include performing a second thinning of the semiconductor body after forming the p-doped zone.

In one or more embodiments, the second thinning may be performed by an electrochemical etch.

In one or more embodiments, the electrochemical etch may be implemented with a tetramethylammonium hydroxide solution (TMAH).

In one or more embodiments, the second thinning may be performed so as to stop at a space charge region of the pn-junction.

A method for producing a semiconductor in accordance with various embodiments may include: providing a semiconductor body having a first side and a second side as a starting semiconductor body; forming an n-doped zone in the semiconductor body by a first implantation of protons into the semiconductor body via the first side down to a first depth location of the semiconductor body; performing a first thinning of the semiconductor body by e.g. mechanical grinding, from the second side; forming a p-doped zone in the semiconductor body by a second implantation into the semiconductor body via the thinned second side up to a second depth location of the semiconductor body, wherein the second depth location of the semiconductor body is at least adjacent to the first depth location of the semiconductor body, such that a pn-junction arises between said n-doped zone and said p-doped zone in the semiconductor body; and performing a second thinning of the semiconductor body from the thinned second side, up to a certain depth defined by a space charge region or the pn-junction.

In one or more embodiments, the first implantation may be an implantation of protons.

In one or more embodiments, the first implantion of protons may be performed in such a manner that the implantation energy lies in the range of between 2 MeV and 5 MeV.

In one or more embodiments, the dose of protons for the first implantation of protons may lie in the range of between $2\times10^{13}$ protons per cm$^2$ and $8\times10^{14}$ protons per cm$^2$ and more typically in the range of between $1\times10^{14}$ protons per cm$^2$ and $4\times10^{14}$ protons per cm$^2$.

In one or more embodiments, the method may include forming a front p-doped zone in a region between the n-doped zone and the first side of the semiconductor body, and converting at least the front p-doped zone by heating at least the front p-doped zone of the semiconductor body, wherein the heat treatment may include a first annealing phase in a temperature range of between 470° C. and 520° C. and having a duration of 1 h to 20 h.

In one or more embodiments, the first thinning of the semiconductor body may subsequently be performed from the second side by e.g., mechanical grinding.

In one or more embodiments, the semiconductor body may be a semiconductor wafer, e.g. a silicon wafer, with a sheet resistance above 1000 Ohm-cm.

In one or more embodiments, the semiconductor body may be a p-doped semiconductor body with a density of holes below $5\times10^{12}$ holes per cm$^3$.

In one or more embodiments, the starting semiconductor body may be an n-doped semiconductor body with a density of donors below $2\times10^{12}$ donors per cm$^3$.

In one or more embodiments, the second depth location may be at the same location as the first depth location of the semiconductor body.

In one or more embodiments, the second depth location may be between the first side and the first depth location of the semiconductor body.

In one or more embodiments, the second depth location may be between the second side and the first depth location of the semiconductor body, and the second depth location is close enough to the first depth location, such that the depth of the resulted pn-junction may be controlled by the n-type doping from the first-side implantation and the p-type doping from the second-side implantation.

In one or more embodiments, the second implantation may be an implantation of protons, with an implantation energy lying in the range of between 1 MeV and 4 MeV, and an implantation dose of protons lying in the range of between $1\times10^{13}$ protons per cm$^2$ and $5\times10^{14}$ protons per cm$^2$.

In one or more embodiments, the method may further include heating at least the second proton-implanted region of the semiconductor body, wherein the heating of at least the second proton-implanted region of the semiconductor body may include an second annealing phase in a temperature range of e.g. between 220° C. and 400° C., e.g. between 320° C. and 380° C., e.g. below 350° C. and having a duration of 1 h to 5 h, to make sure the p-doped zone not being converted into an n-type zone.

In one or more embodiments, the second implantation may be an implantation of Helium, with an implantation energy lying in the range of between 2 MeV and 15 MeV, and an implantation dose of Helium lying in the range of between $5\times10^{12}$ per cm$^2$ and $1\times10^{14}$ per cm$^2$.

In one or more embodiments, the method may further include forming a space charge zone (also referred to herein as "space charge region") spanned at the pn-junction by applying a bias voltage, and removing the second side of the semiconductor body up to at least as far as the space charge zone.

In one or more embodiments, a width can be set for the space charge zone by applying a specific bias voltage value across the pn-junction.

In one or more embodiments, the method may include polarizing the bias voltage across the pn-junction in the forward direction of the pn-junction, wherein the bias voltage is close to a diffusion voltage $U_D$ of the space charge zone, with the result that the space charge zone may be nearly completely dissolved, and the removal of material from the second side ends close to the pn-junction.

In one or more embodiments, the method may include polarizing the bias voltage across the pn-junction in the reverse direction of the pn-junction.

In one or more embodiments, the space charge zone may be formed by diffusion of charge carriers across the pn-junction.

In one or more embodiments, the first thinning from the second side directly subsequent to the formation of the n-doped zone may be implemented by mechanical grinding.

In one or more embodiments, the first thinning from the second side subsequent to the first aneal may be implemented by mechanical grinding.

In one or more embodiments, the second thinning from the second side may be implemented by electrochemical etching in a solution like e.g. potassium hydroxide solution (KOH) or tetramethylammonium hydroxide solution (TMAH).

In one or more embodiments, forming the p-doped zone may include forming a p-type doping maximum in the p-doped zone, wherein the p-type doping maximum may be between the pn-junction and the thinned second side of the semiconductor body.

In one or more embodiments, the p-type zone of the semiconductor body may be used for a p-type emitter for IGBT.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A method for producing a semiconductor, comprising:
   providing a semiconductor body having a first side and a second side;
   forming an n-doped zone in the semiconductor body, comprising:
      performing a first implantation of protons into the semiconductor body via the first side to a first depth location of the semiconductor body, and
      performing a first annealing of the semiconductor body after the first implantation of protons; and
   performing a first thinning from the second side after performing the first annealing;
   forming a p-doped zone in the semiconductor body after performing the first thinning so that a pn-junction forms between said n-doped zone and said p-doped zone in the semiconductor body, comprising:
      performing a second implantation of protons into the semiconductor body via the second side to a second depth location of the semiconductor body,
   performing a second thinning of the semiconductor body after forming the p-doped zone by electrochemically etching the second side of the semiconductor body, wherein the pn-junction is an etching stop so that the electrochemically etching process ends when the pn-junction is reached.

2. The method of claim 1, wherein the first implantation of protons is effected with an implantation energy lying in a range of between 2 MeV and 5 MeV.

3. The method of claim 1, wherein the first implantation of protons is effected with a dose of protons lying in a range of between $2 \times 10^{13}$ protons per cm$^2$ and $8 \times 10^{14}$ protons per cm$^2$.

4. The method of claim 1, wherein the first implantation of protons is effected with a dose of protons lying in a range of between $1 \times 10^{14}$ protons per cm$^2$ and $4 \times 10^{14}$ protons per cm$^2$.

5. The method of claim 1, wherein the first anneal is performed at a temperature range of between 470° C. and 520° C.

6. The method of claim 1, wherein the second depth location is at the same location as the first depth location of the semiconductor body.

7. The method of claim 1, wherein the second depth location is between the first side and the first depth location of the semiconductor body.

8. The method of claim 1, wherein the second depth location is between the second side and the first depth location of the semiconductor body, wherein the second depth location is close enough to the first depth location, such that a depth location of said pn-junction is controlled by the n-doped zone from the first implantation and the p-doped zone from the second implantation.

9. The method of claim 1, wherein the second implantation of protons is effected with an implantation energy lying in a range of between 1 MeV and 4 MeV.

10. The method of claim 1, wherein the second implantation of protons is effected with a dose of protons lying in a range of between $1 \times 10^{13}$ protons per cm$^2$ and $5 \times 10^{14}$ protons per cm$^2$.

11. The method of claim 1, wherein the electrochemical etching is implemented with a tetramethylammonium hydroxide solution (TMAH).

12. The method of claim 1, wherein forming the p-doped zone in the semiconductor body further comprises performing a second annealing of the semiconductor body after the second implantation.

13. The method of claim 12, wherein the second annealing is performed at a temperature range of between 220° C. and 400° C.

* * * * *